United States Patent
Chang

(10) Patent No.: US 11,862,453 B2
(45) Date of Patent: Jan. 2, 2024

(54) GATE STACK FOR METAL GATE TRANSISTOR

(71) Applicant: Marvell Asia Pte, Ltd., Singapore (SG)

(72) Inventor: Runzi Chang, Saratoga, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 5 days.

(21) Appl. No.: 17/445,965

(22) Filed: Aug. 26, 2021

(65) Prior Publication Data

US 2022/0069091 A1 Mar. 3, 2022

Related U.S. Application Data

(60) Provisional application No. 63/071,273, filed on Aug. 27, 2020.

(51) Int. Cl.
*H01L 29/40* (2006.01)
*H01L 29/49* (2006.01)
*H01L 21/3213* (2006.01)
*H01L 29/66* (2006.01)

(52) U.S. Cl.
CPC ...... *H01L 29/401* (2013.01); *H01L 21/32135* (2013.01); *H01L 29/49* (2013.01); *H01L 29/66477* (2013.01)

(58) Field of Classification Search
CPC . H01L 29/401; H01L 21/32135; H01L 29/49; H01L 29/66477; H01L 29/4966; H01L 29/66568; H01L 29/66545
See application file for complete search history.

(56) References Cited

U.S. PATENT DOCUMENTS

| | | | |
|---|---|---|---|
| 2012/0228718 | A1 | 9/2012 | Lin et al. |
| 2013/0075827 | A1* | 3/2013 | Lee ............ H01L 29/66545 438/301 |
| 2015/0147876 | A1 | 5/2015 | Ando et al. |
| 2016/0104644 | A1 | 4/2016 | Liu et al. |
| 2016/0204221 | A1 | 7/2016 | He et al. |
| 2020/0020785 | A1* | 1/2020 | Chang ............ H01L 29/785 |
| 2021/0134671 | A1* | 5/2021 | Xie ............ H01L 29/41791 |

FOREIGN PATENT DOCUMENTS

TW 201306133 2/2013

* cited by examiner

*Primary Examiner* — Thanhha S Pham

(57) ABSTRACT

Forming a metal gate transistor includes forming a semiconductor channel in a substrate, and depositing a source electrode and a drain electrode on the semiconductor channel. The source and drain electrodes are spaced apart. Dielectric spacers are provided above the source and drain electrodes to define a gate void spanning the source and drain electrodes. A dielectric layer is deposited on a bottom wall and sidewalls of the gate void. A work-function metal layer is deposited on the dielectric layer. The work-function metal layer is etched away from the sidewalls leaving the work-function metal layer on the bottom wall to control work function between the semiconductor channel and a conductive metal gate material to be deposited. The gate void above the work-function metal layer on the bottom wall, and between the dielectric layers on the sidewalls, is filled with the conductive metal gate material.

5 Claims, 4 Drawing Sheets

GATE STACK FOR METAL GATE TRANSISTOR

CROSS REFERENCE TO RELATED APPLICATIONS

This disclosure claims the benefit of copending, commonly-assigned U.S. Provisional Patent Application No. 63/071,273, filed Aug. 27, 2020, which is hereby incorporated by reference herein in its entirety.

FIELD OF USE

This disclosure relates to metal-gate metal-oxide-semiconductor field-effect transistors (MOSFETs). More particularly, this disclosure relates to a gate stack for a metal-gate MOSFET having an increased volume of conductive metal gate material.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

The gate stack of a metal-gate MOSFET typically includes, in order, a dielectric layer closest to the semiconductor channel, a work-function metal layer (used to adjust the work function between the semiconductor and the metal gate), and a conductive metal gate electrode layer. For reasons described in more detail below, as transistor feature sizes decrease, the fraction of the volume of the gate stack occupied by the conductive metal gate electrode layer decreases, which increases the resistance of the gate. At the same time, decreasing feature size shortens the distance between the source and the drain of the MOSFET, reducing switching power. The effect of the reduced switching power is exacerbated by the increased gate resistance.

SUMMARY

In accordance with implementations of the subject matter of this disclosure, a method of forming a metal gate transistor includes forming a semiconductor channel in a semiconductor substrate, depositing a source electrode and a drain electrode on the semiconductor channel, the source electrode and the drain electrode being spaced apart to define a source-to-drain direction parallel to major plane of the semiconductor substrate, providing dielectric spacers above the source electrode and the drain electrode, the dielectric spacers defining a gate void spanning the source electrode and the drain electrode, depositing a dielectric layer on a bottom wall and sidewalls of the gate void, depositing a work-function metal layer on the dielectric layer on the bottom wall and the sidewalls, etching away the work-function metal layer from the sidewalls leaving the work-function metal layer on the bottom wall to control work function between the semiconductor channel and a conductive metal gate material to be deposited, and filling the gate void above the work-function metal layer on the bottom wall, and between the dielectric layers on the sidewalls, with the conductive metal gate material.

A first implementation of such a method may further include, after depositing the dielectric layer on the bottom wall and the sidewalls, and after depositing the work-function metal layer on the dielectric layer on the bottom wall and the sidewalls, and before etching away the work-function metal layer from the sidewalls, filling the gate void above the work-function metal layer on the bottom wall, and between the work-function metal layers on the sidewalls, with an initial deposit of the conductive metal gate material, and etching away at least a portion of the initial deposit of the conductive metal gate material when etching away the work-function metal layer from the sidewalls.

In a second implementation of such a method, providing the dielectric spacers defining the gate void may include defining the gate void with a first dimension in the source-to-drain direction, and a second dimension perpendicular to the substrate, the second dimension being greater than the first dimension.

In a third implementation of such a method, depositing the dielectric layer may be performed using a vapor deposition technique.

In a fourth implementation of such a method, depositing the work-function metal layer may be performed using a vapor deposition technique.

In a fifth implementation of such a method, the etching may be performed using a combination of gas phase etching and wet etching.

In accordance with implementations of the subject matter of this disclosure, a method of forming a metal gate transistor includes forming a semiconductor channel in a semiconductor substrate, depositing a source electrode and a drain electrode on the semiconductor channel, the source electrode and the drain electrode being spaced apart to define a source-to-drain direction parallel to major plane of the semiconductor substrate, providing dielectric spacers above the source electrode and the drain electrode, the dielectric spacers defining a gate void spanning the source electrode and the drain electrode, depositing a dielectric layer on a bottom wall of the gate void, depositing a work-function metal layer on the dielectric layer on the bottom wall to control work function between the semiconductor channel and a conductive metal gate material to be deposited, and filling the gate void above the work-function metal layer on the bottom wall, and between the spacers on the sidewalls, with the conductive metal gate material.

In a first implementation of such a method, depositing the dielectric layer may be performed using atomic layer deposition.

In a second implementation of such a method, depositing the work-function metal layer may be performed using atomic layer deposition.

In a third implementation of such a method, depositing the dielectric layer may be performed using a pulsed deposition layer technique.

In a fourth implementation of such a method, depositing the work-function metal layer may be performed using a pulsed deposition layer technique.

In accordance with implementations of the subject matter of this disclosure, a metal gate transistor structure includes a semiconductor channel formed in a semiconductor substrate, a source electrode and a drain electrode deposited on the semiconductor channel, the source electrode and the drain electrode being spaced apart to define a source-to-drain direction parallel to major plane of the semiconductor substrate, dielectric spacers above the source electrode and the drain electrode, the dielectric spacers defining a gate void spanning the source electrode and the drain electrode, a dielectric layer on a bottom wall of the gate void, a work-function metal layer above the dielectric layer on the bottom wall to control work function between the semiconductor channel and material in the gate void, and a conductive metal gate material filling the gate void except where the dielectric layer and the work-function metal layer are present.

In a first implementation of such a metal gate transistor structure, the dielectric layer may also be present on sidewalls of the gate void.

In accordance with implementations of the subject matter of this disclosure, a metal gate transistor is produced by the process including forming a semiconductor channel in a semiconductor substrate, depositing a source electrode and a drain electrode on the semiconductor channel, the source electrode and the drain electrode being spaced apart to define a source-to-drain direction parallel to major plane of the semiconductor substrate, providing dielectric spacers above the source electrode and the drain electrode, the dielectric spacers defining a gate void spanning the source electrode and the drain electrode, depositing a dielectric layer on a bottom wall and sidewalls of the gate void, depositing a work-function metal layer on the dielectric layer on the bottom wall and the sidewalls to control work function between the semiconductor channel and a conductive metal gate material to be deposited, etching away the work-function metal layer from the sidewalls leaving the work-function metal layer on the bottom wall, and filling the gate void above the work-function metal layer on the bottom wall, and between the dielectric layers on the sidewalls, with the conductive metal gate material.

In a first implementation, the metal gate transistor is produced by a process that further includes, after depositing the dielectric layer on the bottom wall and the sidewalls, and after depositing the work-function metal layer on the dielectric layer on the bottom wall and the sidewalls, and before etching away the work-function metal layer from the sidewalls, filling the gate void above the work-function metal layer on the bottom wall, and between the work-function metal layers on the sidewalls, with an initial deposit of the conductive metal gate material, and etching away at least a portion of the initial deposit of the conductive metal gate material when etching away the work-function metal layer from the sidewalls.

In a second implementation, the metal gate transistor is produced by a process in which providing the dielectric spacers defining the gate void may include defining the gate void with a first dimension in the source-to-drain direction, and a second dimension perpendicular to the substrate, the second dimension being greater than the first dimension.

In a third implementation, the metal gate transistor is produced by a process in which depositing the dielectric layer may be performed using a vapor deposition technique.

In a fourth implementation, the metal gate transistor is produced by a process in which depositing the work-function metal layer may be performed using a vapor deposition technique.

In a fifth implementation, the metal gate transistor is produced by a process in which the etching may be performed using a combination of gas phase etching and wet etching.

In accordance with implementations of the subject matter of this disclosure, a metal gate transistor is produced by the process including forming a semiconductor channel in a semiconductor substrate, depositing a source electrode and a drain electrode on the semiconductor channel, the source electrode and the drain electrode being spaced apart to define a source-to-drain direction parallel to major plane of the semiconductor substrate, providing dielectric spacers above the source electrode and the drain electrode, the dielectric spacers defining a gate void spanning the source electrode and the drain electrode, depositing a dielectric layer on a bottom wall of the gate void, depositing a work-function metal layer on the dielectric layer on the bottom wall to control work function between the semiconductor channel and a conductive metal gate material to be deposited, and filling the gate void above the work-function metal layer on the bottom wall, and between the spacers on the sidewalls, with the conductive metal gate material.

In a first implementation, the metal gate transistor is produced by a process in which depositing the dielectric layer may be performed using atomic layer deposition.

In a second implementation, the metal gate transistor is produced by a process in which depositing the work-function metal layer may be performed using atomic layer deposition.

In a third implementation, the metal gate transistor is produced by a process in which depositing the dielectric layer may be performed using a pulsed deposition layer technique.

In a fourth implementation, the metal gate transistor is produced by a process in which depositing the work-function metal layer may be performed using a pulsed deposition layer technique.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
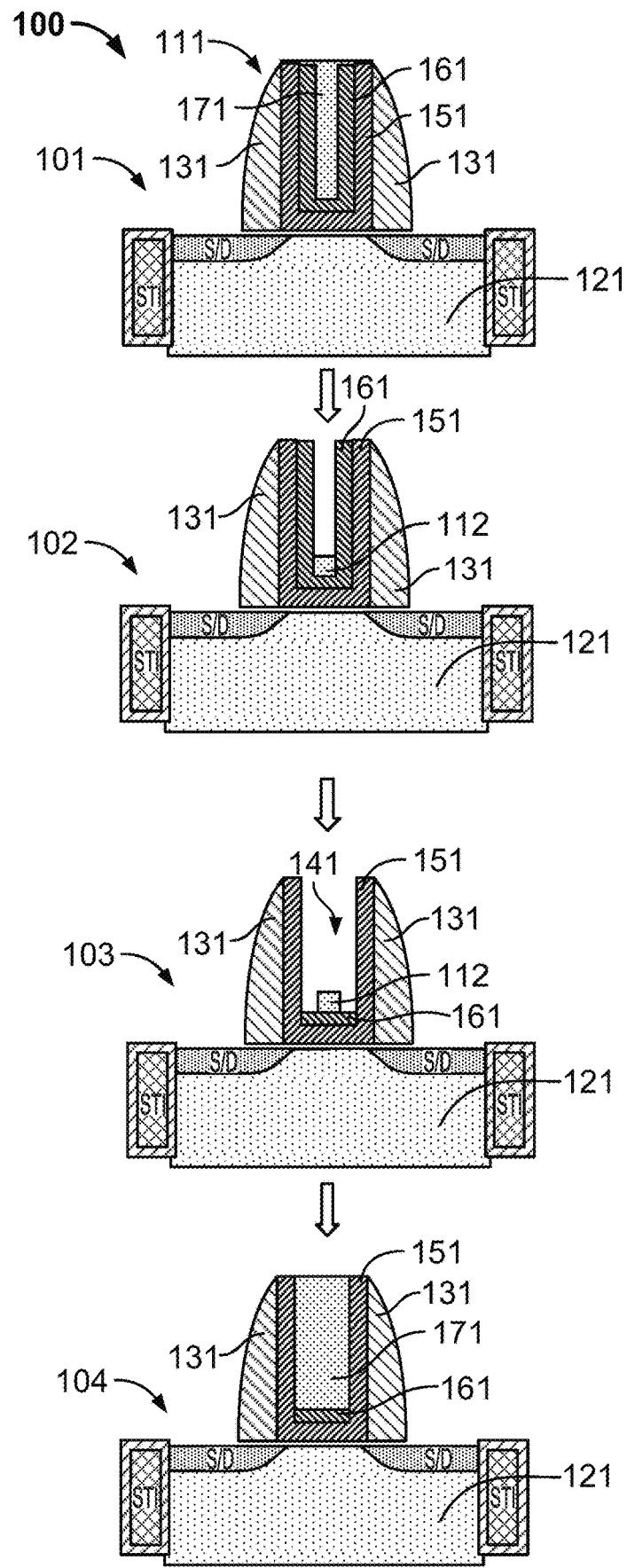
FIG. 1 illustrates the various stages in the formation of a transistor gate stack according to a first implementation of the subject matter of this disclosure.

Typically, a MOSFET is formed by dividing a semiconductor substrate into a plurality of active channel regions—e.g., using shallow trench isolation (STI)—with each active channel region forming the basis of single MOSFET. Source and drain electrodes are formed at opposite ends of the channel, and a gate structure is deposited, spanning the source and drain electrodes and the semiconductor channel material between the electrodes. The gate structure is typically a stack including a dielectric layer in contact with the semiconductor material and with the source and drain electrodes, a work-function metal layer above the dielectric layer (for purposes of this discussion, the semiconductor substrate may be considered the "bottom" of the transistor structure regardless of the orientation of the transistor structure relative to an observer), and a conductive metal gate electrode layer above the work-function metal layer. The work-function metal layer may be, for example, titanium nitride, tantalum nitride, or titanium aluminum carbide.

In order to form the gate stack structure, spacers of an insulating or dielectric material (e.g., silicon nitride) may be formed, serving as the walls of a void to be filled with the gate stack materials. The dielectric layer is deposited first, typically using a vapor deposition technique—i.e., chemical vapor deposition (CVD) or physical vapor deposition (PVD). The dielectric layer may be formed directly on the silicon channel layer, or a thin layer of interfacial oxide may first be formed on the silicon layer. The work-function metal layer is then deposited over the dielectric layer (or over the interfacial oxide), again typically using a vapor deposition technique (CVD or PVD). The balance of the void may then be filled with the conductive metal gate electrode layer by CVD, PVD, atomic layer deposition (ALD), or any other suitable deposition technique.

Because of the nature of vapor deposition techniques, the dielectric layer and the work-function metal layer are deposited not only at the bottom of the void formed by the spacers, but on the sidewalls of that void as well. Therefore, deposition of the dielectric layer and the work-function metal layer decrease the void volume not only by the thickness of two layers at the bottom of the void, but also by the thicknesses of two layers on each of the sidewalls. Thus, the sidewall-to-sidewall distance is decreased by four layer thicknesses before the conductive metal gate material is deposited. As transistor feature sizes decrease at ever-smaller process nodes, the fraction of the void volume occupied by the dielectric layer and the work-function metal layer increases, decreasing the fraction of that volume available for the conductive metal gate material, and thereby increasing the resistance of the conductive gate electrode. And because the surface area of the conductive metal gate material will be smaller at the top of the gate stack, the contact resistance of the gate will also increase.

For example, at a 5-nm process node, the source-to-drain distance may be only 20 nm. With the dielectric layer and the work-function metal layer occupying 2-3 nm each, the void remaining for the conductive metal gate material may have a dimension of only 8-12 nm in the source-to-drain direction. That dimension becomes even smaller at smaller process nodes (e.g., a 3-nm process node) as the source-to-drain distance shrinks but the layer thicknesses remain about the same.

However, the sidewall portions of the dielectric layer and the work-function metal layer do not contribute to operation of the transistor. Therefore, in accordance with implementations of the subject matter of this disclosure, the gate stack of a metal gate MOSFET is formed with a higher proportion of the conductive gate metal material, by eliminating the sidewall portions of at least the work-function metal layer.

According to a first implementation of the subject matter of this disclosure, the gate stack may be formed as described above, and then the sidewalls of the work-function metal layer, as well as most (or all) of the conductive gate metal material are selectively etched away, leaving the dielectric layer on the bottom and sidewalls, but only the bottom portion of the work-function metal (and possibly a small amount of the conductive gate metal material). Depositing and then etching away the conductive gate metal material, as opposed to not depositing the conductive gate metal material at all, provides a topography which facilitates the selective removal of the work-function metal from the side walls. The void that results within the dielectric layer sidewalls, after the work-function metal is removed from the sidewalls, is then filled with the conductive metal gate material (e.g., aluminum or tungsten).

In a variant of this first implementation, the sidewalls of the work-function metal layer may be selectively etched away before any of the conductive gate metal material is deposited. However, the selective etching may be more difficult than when the conductive gate metal material is first deposited and then etched away.

According to either variant of the first implementation, the resulting gate structure has a cross section, when viewed perpendicular to the source-to-drain direction, having a U-shaped dielectric layer within the spacers, a work-function metal layer across the bottom of the "U" of the dielectric layer, and a volume of the conductive gate metal material above the work-function metal layer and between the dielectric material sidewalls. The top of the gate stack may be polished using typical techniques such as Chemical-Mechanical Planarization (CMP).

According to a second implementation of the subject matter of this disclosure, instead of a using vapor deposition techniques to deposit the dielectric layer and the work-function metal layer, the dielectric layer and the work-function metal layer may be deposited using a deposition technique that provides greater control, so that neither the dielectric layer nor the work-function metal layer is deposited on the sidewalls. For example, atomic-layer deposition (ALD) may be used to deposit the dielectric layer and the work-function metal layer. Alternatively, a pulsed deposition layer (PDL) technique, which provides a degree of control similar to ALD at a speed comparable to vapor deposition techniques, may be used.

The result according to this second implementation is that the dielectric layer and the work-function metal layer are formed only at the bottom of the gate-forming void within the spacers, and the remaining void is then filled with the conductive metal gate material (e.g., aluminum or tungsten).

Regardless of which implementation is used, the contact area of the conductive metal gate will be larger than for a corresponding structure formed according to typical processes. Therefore, the contact resistance between the gate and any circuit element coupled to the gate will be reduced as compared to the typical structure.

The subject matter of this disclosure may be better understood by reference to FIGS. 1-4.

FIG. 1 illustrates the various stages in the formation of a transistor gate stack according to the first implementation described above. As of stage 101, a MOSFET 111 has been fully formed according to conventional techniques. Semiconductor substrate 121 (which forms the active transistor channel) and spacer sidewalls 131 define a gate space or void 141 with a cross section that is larger in the dimension normal to substrate 121 ("height") than in the dimension parallel to the major plane of substrate 121 ("width"). Gate space or void 141 contains, on its "bottom" wall—i.e., the wall adjacent substrate 121—and its "side" walls—i.e., the walls formed by spacers 131, U-shaped layers of dielectric material 151 and work-function metal 161. The remainder of space or void 141 is filled with a conductive metal gate material 171 (e.g., aluminum or tungsten).

As of stage 102, the originally deposited conductive metal gate material 171 has been selectively removed. The selective removal may be performed by etching. In some implementations, this etching may be implemented by gas phase etching by chlorine plasma combined with wet etching. In some implementations, all of the conductive metal gate material 171 may be removed at stage 102, but in other implementations, a small amount of the conductive metal gate material 171 may remain along the bottom wall, as shown at 112.

As of stage 103, the work-function metal 161 has been selectively removed from the sidewalls of gate space or void 141. Again, the removal of work-function metal 161 may be performed by etching. The portion 112 of conductive metal gate material remains, and the now-empty portions of gate space or void 141 is filled with the conductive metal gate material 171 at stage 104. As discussed above, the result is that a higher proportion of gate space or void 141 is filled with conductive metal gate material 171 than in typical transistor gate stack structures. The "top" of this structure can be polished by chemical mechanical planarization ("CMP").

Figure 2:
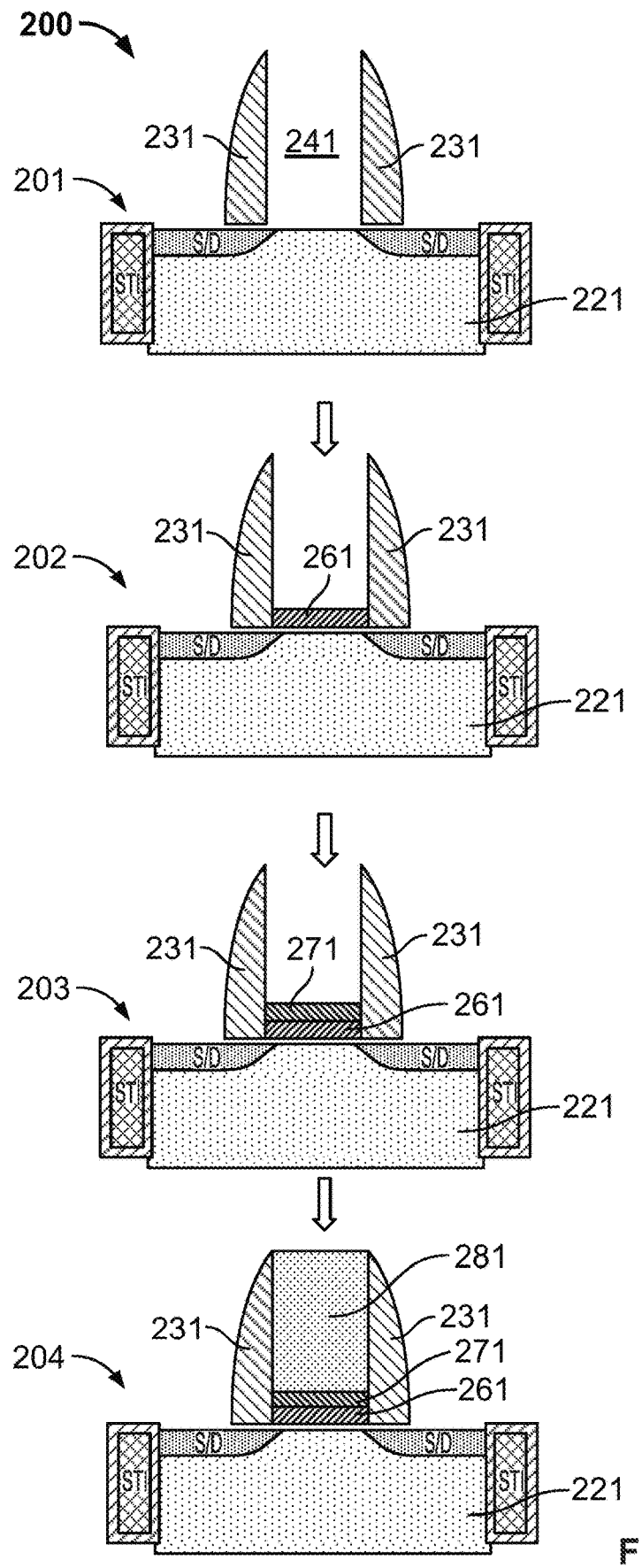
FIG. 2 illustrates the various stages in the formation of a transistor gate stack according to a second implementation of the subject matter of this disclosure.

FIG. 2 illustrates the various stages in the formation of a transistor gate stack according to the second implementation described above. As of stage 201, semiconductor substrate 221 (which forms the active transistor channel) and spacer sidewalls 231 define a gate space or void 241 with a cross section that is larger in the dimension normal to substrate 221 ("height") than in the dimension parallel to the major plane of substrate 221 ("width"). The gate space or void 241 is empty and its "bottom" wall—i.e., the wall adjacent substrate 121—is exposed semiconductor substrate 221. In some implementations, there may be a thin layer of interfacial oxide—e.g., a silicon oxide—on top of the transistor channel.

As of stage 202, the dielectric material layer 261 is selectively grown on top of the exposed semiconductor substrate. The dielectric material may be grown with atomic layer deposition, ("ALD") or pulsed deposition layer deposition ("PDL"), which is ALD-type step coverage at CVD-type rates leading to high throughput. Selectively growing the dielectric material leads to coverage of the "bottom" wall—i.e., the wall adjacent substrate 121—of the gate-space or void 241 without covering the side walls.

As of stage 203, the work-function metal 271 is selectively grown on top of the dielectric material layer 261. Again, the work-function metal layer 271 may be grown with ALD or PDL. Selectively growing the work-function metal 271 on top of the dielectric material layer 261 leads to coverage of the "bottom" wall—i.e., the wall adjacent substrate 121—of the gate-space or void 241 on top of the dielectric layer without covering the side walls.

As of stage 204, the empty portion of the gate space or void 241 is filled with the conductive metal gate material 281. As discussed above, the result is that a higher proportion of gate space or void 241 is filled with conductive metal gate material 281 than in typical transistor gate stack structures. As in the implementation of FIG. 1, the top of this structure can be polished by CMP.

Figure 3:
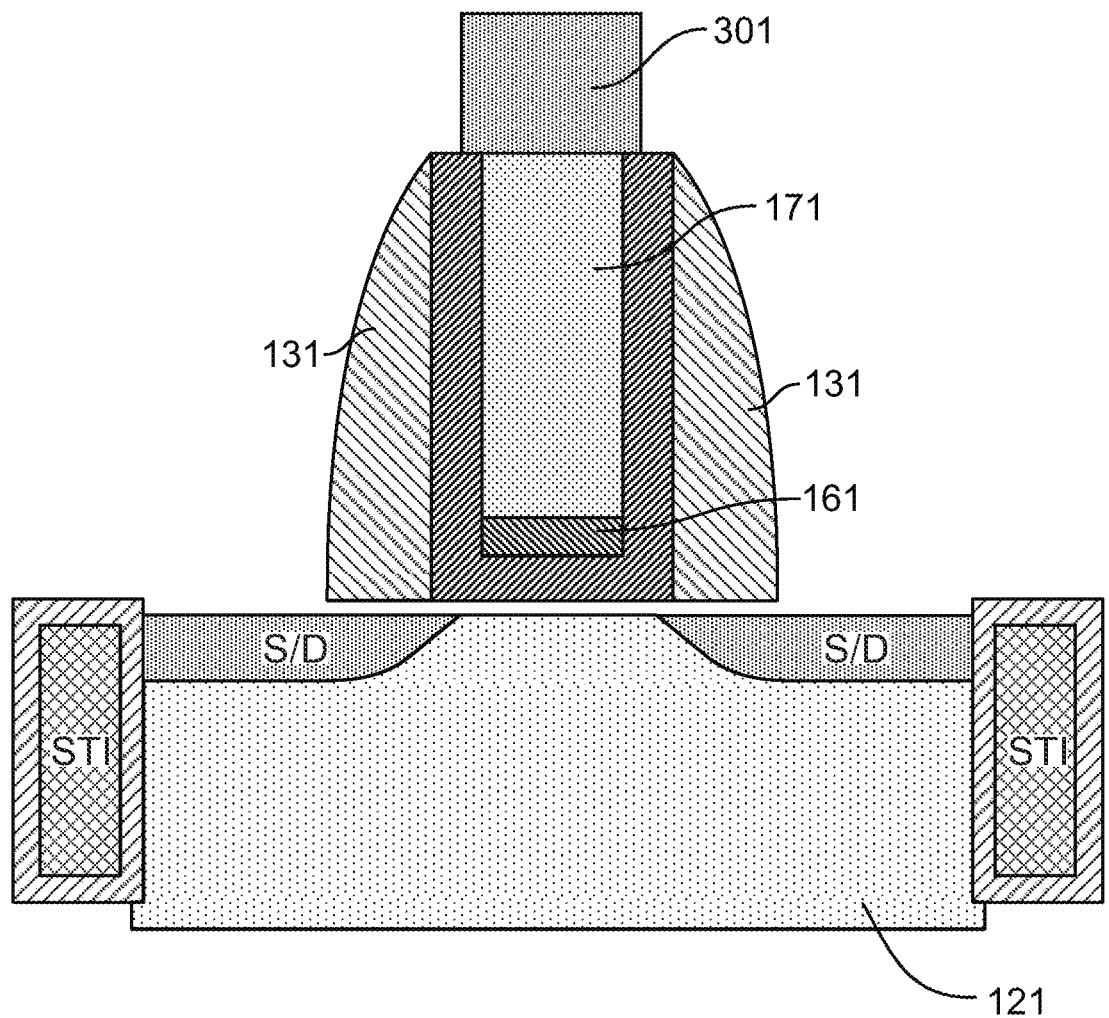
FIG. 3 illustrates how a gate contact may be formed atop the metal gate of a transistor formed according to implementations of the subject matter of this disclosure.

In order to use a transistor formed in accordance with the implementation of FIG. 1 or the implementation of FIG. 2, a gate contact is formed atop the transistor gate stack so that a gate control voltage may be applied. FIG. 3 illustrates such a gate contact 301 formed atop the metal gate material 171 of a transistor formed according to the first implementation described above in connection with FIG. 1. Gate contact 301 will have lower contact resistance than gate contacts in typical transistors as a result of the larger surface area of the conductive metal gate material 171 at the top of the structure. The same would be even more true in the case of a transistor formed according to the second implementation described above in connection with FIG. 2 (not shown), because of the even larger surface area of metal gate material 281 in the absence of dielectric material 151.

Figure 4:
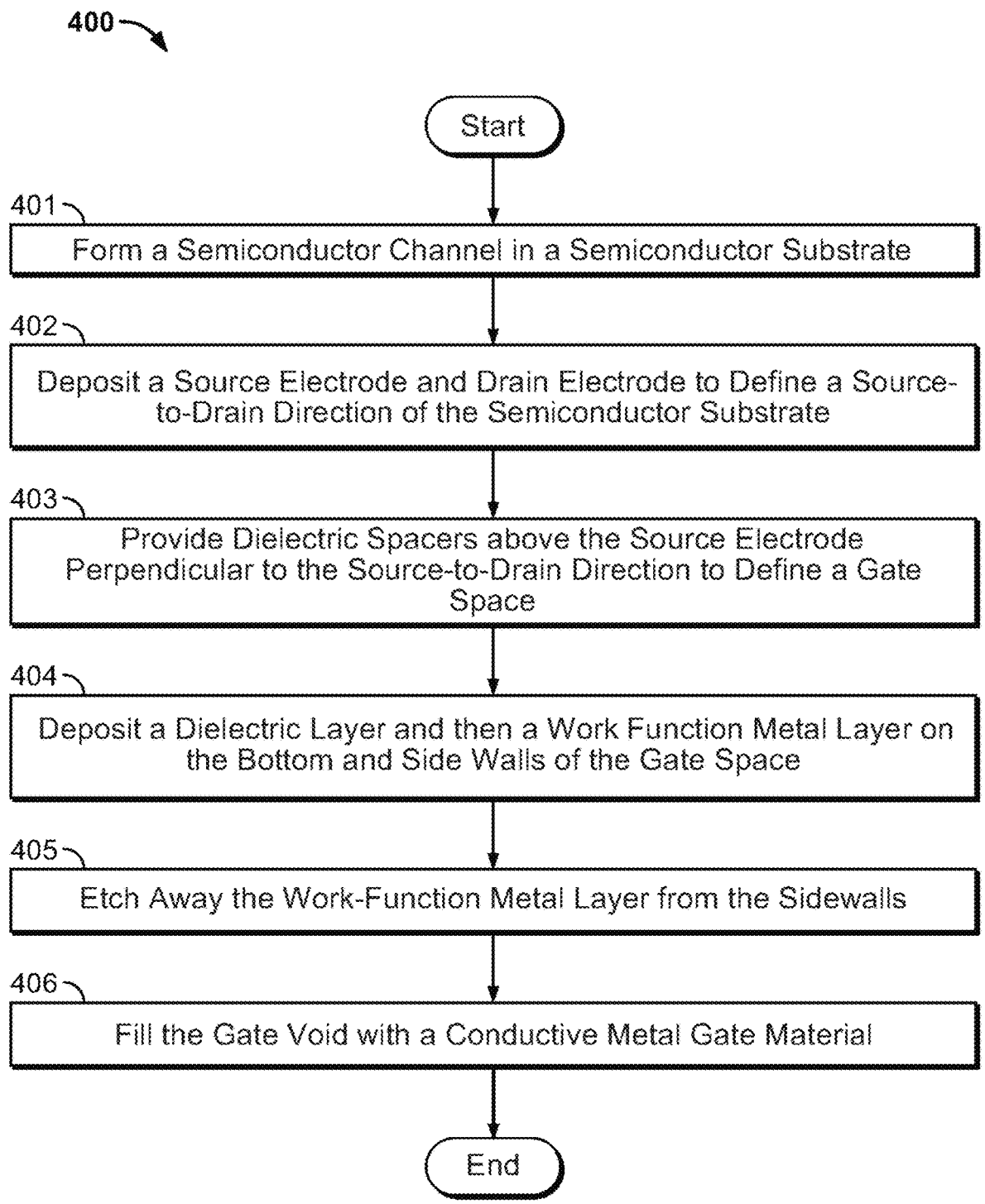
FIG. 4 is a flow diagram illustrating a method according to implementations of the subject matter of this disclosure.

FIG. 4 is a flow diagram illustrating a method according to implementations of this disclosure for forming a metal gate transistor as described above.

At 401, a semiconductor channel in a semiconductor substrate is formed. At 402, source and drain electrodes are deposited to define a source-to-drain direction of the semiconductor substrate. At 403, dielectric spacers are provided above the source electrode and perpendicular to the source-to-drain direction define a gate space, where layers of dielectric material and work-function metal may be deposited on the bottom and side walls at 404. The work-function metal is etched away from the side walls at 405, and the gate space is filled with conductive metal gate material at 406. The top of this structure can be polished by CMP (not shown) before method 400 ends.

Thus it is seen that a transistor having a metal gate with a higher proportion of the conductive gate material, as well as methods for forming such a transistor, have been provided As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of forming a metal gate transistor, the method comprising:

forming a semiconductor channel in a semiconductor substrate;

depositing a source electrode and a drain electrode on the semiconductor channel, the source electrode and the drain electrode being spaced apart to define a source-to-drain direction parallel to major plane of the semiconductor substrate;

providing dielectric spacers above the source electrode and the drain electrode, the dielectric spacers defining a gate void spanning the source electrode and the drain electrode;

depositing a portion of a dielectric layer on a bottom wall and portions of the dielectric layer on sidewalls of the gate void;

depositing a portion of a work-function metal layer on the portion of the dielectric layer on the bottom wall and portions of the work-function metal layer on the portions of the dielectric layer on the sidewalls;

etching away the portions of the work-function metal layer on the sidewalls leaving the portion of the work-function metal layer on the bottom wall to control work function between the semiconductor channel and a conductive metal gate material to be deposited;

filling the gate void above the portion of the work-function metal layer on the bottom wall, and between the portions of the dielectric layers on the sidewalls, with the conductive metal gate material, the conductive metal gate material directly contacting the portions of the dielectric layers on the sidewalls and directly contacting the portion of the work-function metal layer on the bottom wall; and after depositing the portions of the dielectric layer on the bottom wall and the portions of the dielectric layer on the sidewalls, and after depositing the portion of the work-function metal layer on the dielectric layer on the bottom wall and portions of the work-function metal layer on the portions of the dielectric layer on the sidewalls, and before etching away portions of the work-function metal layer from the sidewalls, the method further comprising:

filling the gate void above the portion of the work-function metal layer on the bottom wall, and between the portions of the work-function metal layers on the sidewalls, with an initial deposit of the conductive metal gate material, and etching away at least a portion of the initial deposit of the conductive metal gate material.

2. The method of claim 1 wherein providing the dielectric spacers defining the gate void comprises defining the gate void with a first dimension in the source-to-drain direction, and a second dimension perpendicular to the substrate, the second dimension being greater than the first dimension.

3. The method of claim 1 wherein depositing the dielectric layer is performed using a vapor deposition technique.

4. The method of claim 1 wherein depositing the work-function metal layer is performed using a vapor deposition technique.

5. The method of claim 1 wherein the etching is performed using a combination of gas phase etching and wet etching.

* * * * *